(12) United States Patent
Chen et al.

(10) Patent No.: US 8,878,318 B2
(45) Date of Patent: Nov. 4, 2014

(54) STRUCTURE AND METHOD FOR A MRAM DEVICE WITH AN OXYGEN ABSORBING CAP LAYER

(75) Inventors: Chih-Ming Chen, Hsinchu (TW); Ya-Chen Kao, Taoyuan County (TW); Ming-Te Liu, Taipei (TW); Chung-Yi Yu, Hsin-Chu (TW); Cheng-Yuan Tsai, Chu-Pei (TW); Chun-Jung Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 467 days.

(21) Appl. No.: 13/244,349

(22) Filed: Sep. 24, 2011

(65) Prior Publication Data
US 2013/0075839 A1 Mar. 28, 2013

(51) Int. Cl.
*H01L 43/08* (2006.01)
*G11C 11/15* (2006.01)
*H01L 43/12* (2006.01)

(52) U.S. Cl.
CPC .............. *H01L 43/12* (2013.01); *G11C 11/15* (2013.01); *H01L 43/08* (2013.01)
USPC ............ 257/421; 257/E43.001; 257/E43.004; 365/158; 365/171

(58) Field of Classification Search
CPC ......... H01L 43/00; H01L 43/08; H01L 43/10; H01L 29/82; G11C 11/02; G11C 11/15; G11C 11/16; G11C 11/161
USPC ............ 257/421, E43.001, 43.004, E29.323; 365/158, 171
See application file for complete search history.

(56) References Cited

U.S. PATENT DOCUMENTS

| 7,345,855 B2 * | 3/2008 | Parkin ........................ 360/324.2 |
| 7,770,282 B2 * | 8/2010 | Zeltser et al. .............. 29/603.14 |
| 2004/0201929 A1 | 10/2004 | Hashimoto et al. |
| 2005/0260772 A1 | 11/2005 | Horng et al. |
| 2007/0201265 A1 | 8/2007 | Ranjan et al. |
| 2008/0291584 A1 | 11/2008 | Parkin |
| 2009/0173977 A1 | 7/2009 | Xiao et al. |
| 2014/0048893 A1 | 2/2014 | Wu et al. |

OTHER PUBLICATIONS

Unpublished U.S. patent application filed Sep. 22, 2011, titled "Technique for Smoothing an Interface Between Layers of a Semiconductor Device," U.S. Appl. No. 13/240,714, 32 pages.
Unpublished U.S. patent application filed Sep. 24, 2011, titled "Method and Structure for a MRAM Device with Bilayer Passivation," U.S. Appl. No. 13/244,346, 20 pages.

* cited by examiner

*Primary Examiner* — Allison P Bernstein
(74) *Attorney, Agent, or Firm* — Haynes and Boone, LLP (57) ABSTRACT

MTJ stack structures for an MRAM device include an MTJ stack having a pinned ferromagnetic layer over a pinning layer, a tunneling barrier layer over the pinned ferromagnetic layer, a free ferromagnetic layer over the tunneling barrier layer, a conductive oxide layer over the free ferromagnetic layer, and an oxygen-based cap layer over the conductive oxide layer.

20 Claims, 9 Drawing Sheets

STRUCTURE AND METHOD FOR A MRAM DEVICE WITH AN OXYGEN ABSORBING CAP LAYER

BACKGROUND

In integrated circuit (IC) devices, magnetic random access memory (MRAM) is an emerging technology for next generation embedded memory devices. MRAM is a memory device including an array of MRAM cells each of which stores a bit of data using resistance values, rather than electronic charge. Each MRAM cell includes a magnetic tunnel junction ("MTJ") cell, the resistance of which can be adjusted to represent logic "0" or logic "1." Conventionally, the MTJ cell includes an anti-ferromagnetic ("AFM") pinning layer, a ferromagnetic fixed, or pinned, layer, a thin tunneling barrier layer, and a free ferromagnetic layer. The resistance of the MTJ cell may be adjusted by changing the direction of the magnetic moment of the free ferromagnetic layer with respect to that of the fixed magnetic layer. In particular, when the magnetic moment of the free ferromagnetic layer is parallel to that of the ferromagnetic fixed layer, the resistance of the MTJ cell is low, corresponding to a logic 0, whereas when the magnetic moment of the free ferromagnetic layer is anti-parallel to that of the ferromagnetic fixed layer, the resistance of the MTJ cell is high, corresponding to a logic 1. The MTJ cell is coupled between top and bottom electrodes and an electric current flowing through the MTJ cell from one electrode to the other may be detected to determine the resistance, and therefore the logic state, thereof.

However, an oxygen-containing material layer adjacent the free layer may diffuse to the free layer during high temperature processes performed during back-end-of-line ("BEOL") fabrication processes. The diffused oxygen will substantially degrade the magnetic performance of free layer due to the oxidation effect from oxide cap layer. In particular, the damage from the oxygen will significantly increase the resistive area ("RA") and degrade the magnetoresistance percentage ("MR %") of the MTJ cell.

Accordingly, it would be desirable to provide an improved STT-MRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
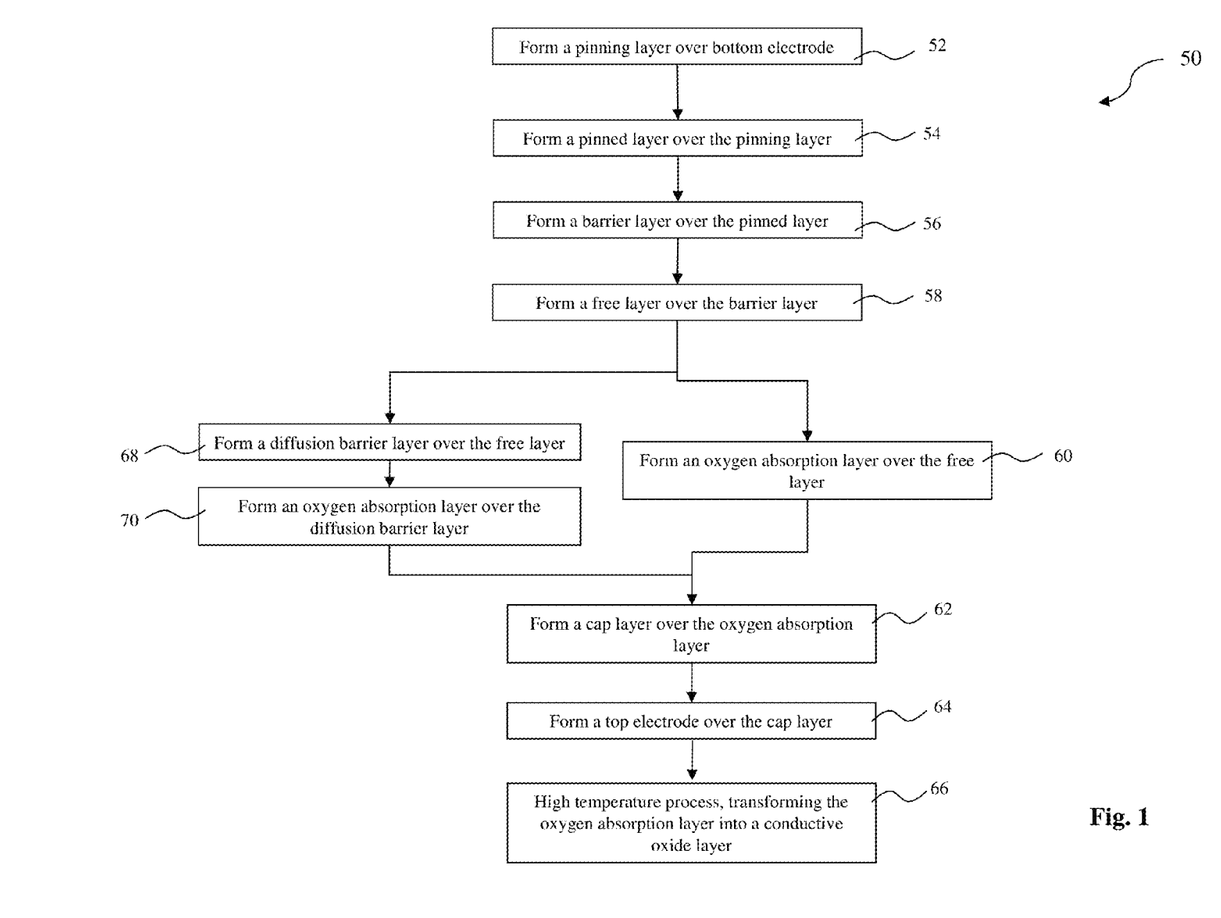
FIG. 1 is a flowchart of a method making of a semiconductor memory device constructed according to aspects of the present disclosure in various embodiments.
Figure 2:
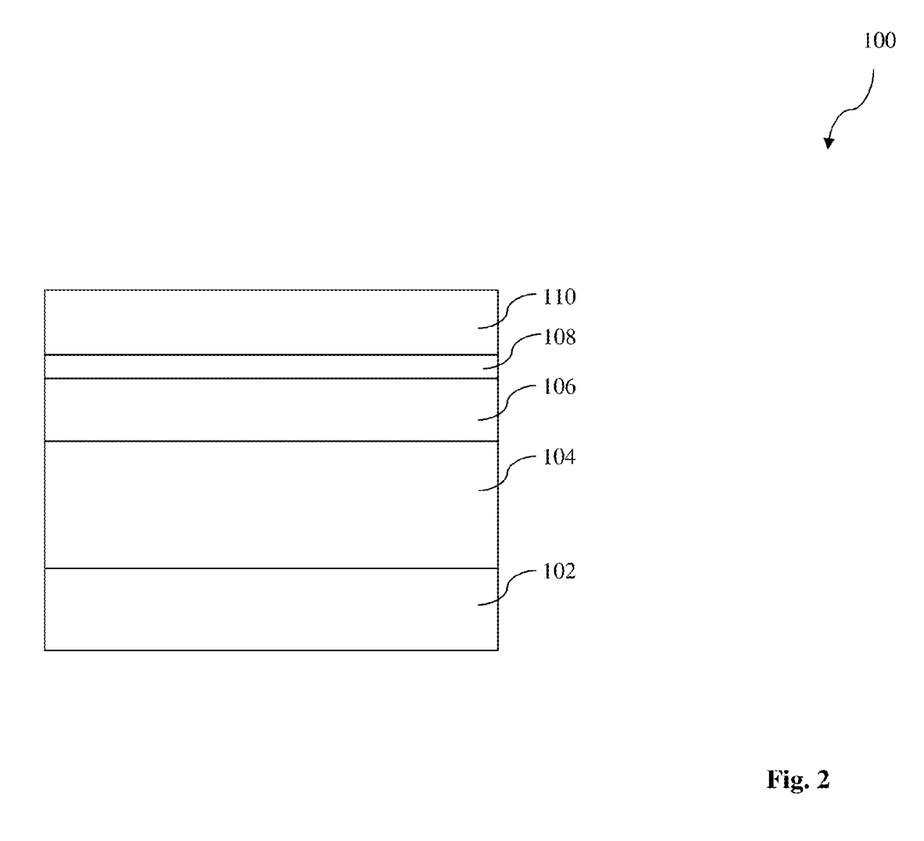
FIGS. 2 through 4 are sectional views illustrating an embodiment of a semiconductor memory device at various fabrication stages constructed according to aspects of the present disclosure in one embodiment.
Figure 3:
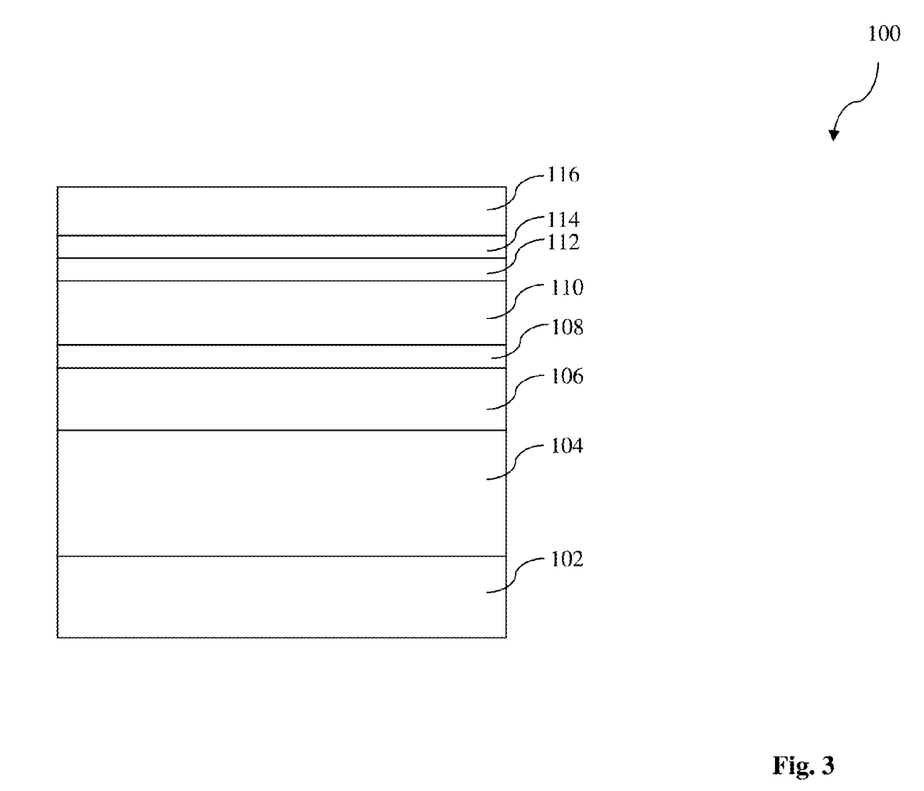
Figure 4:
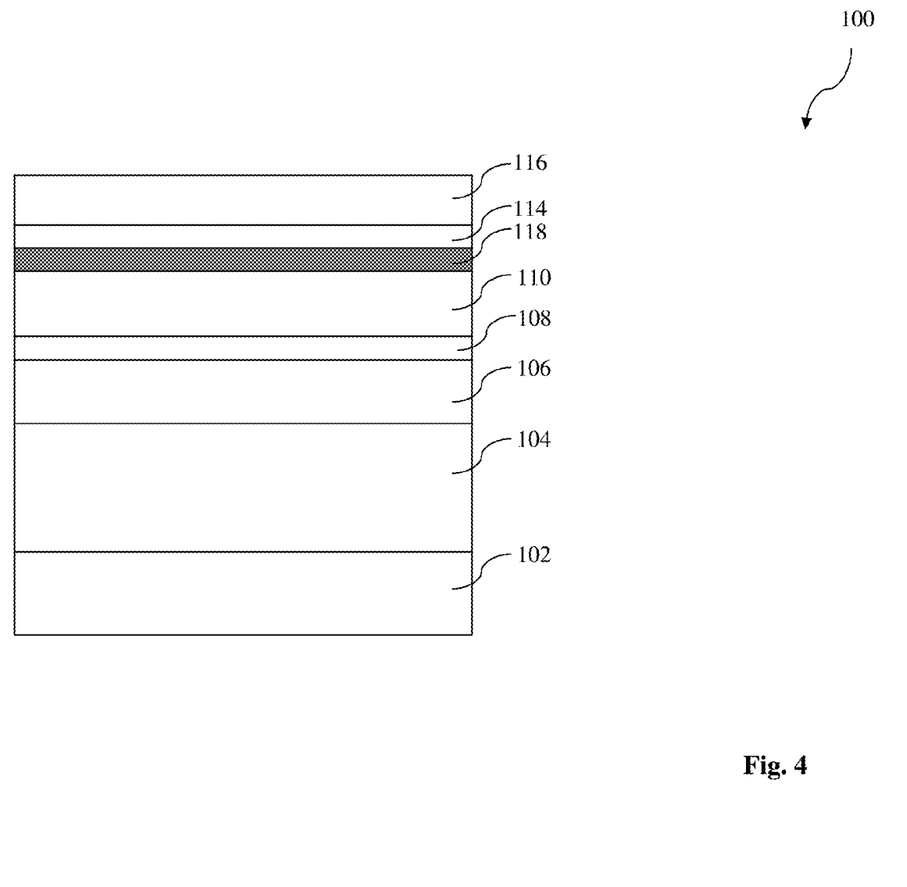
Figure 5:
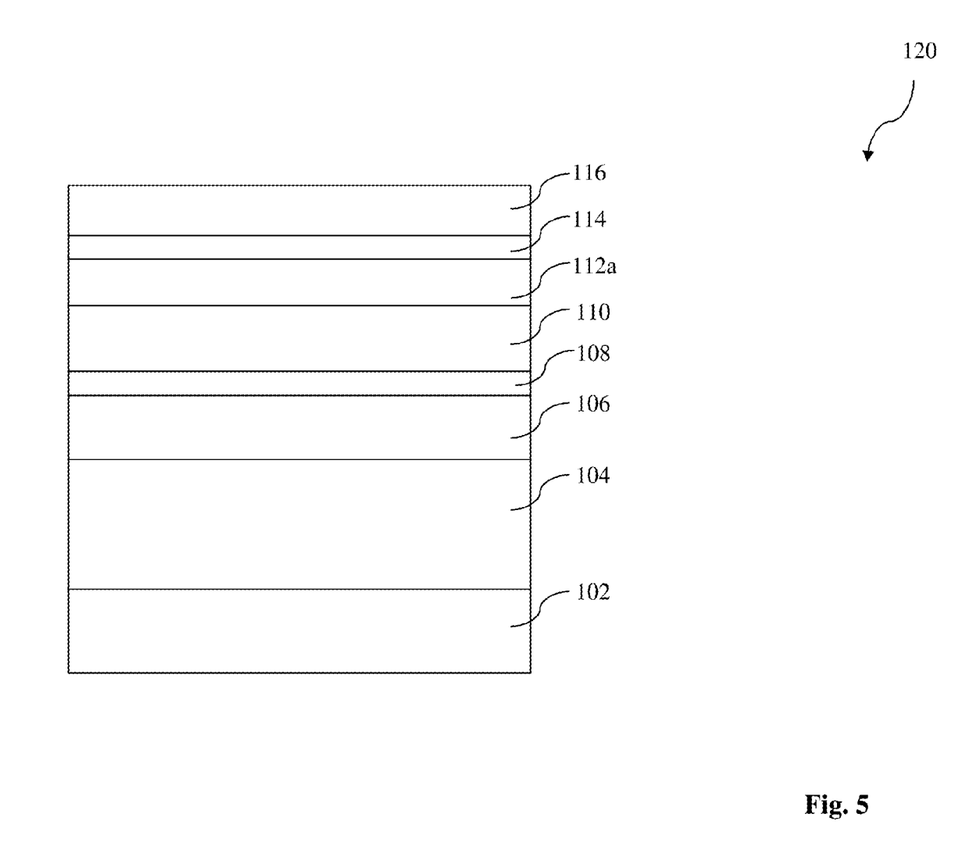
FIGS. 5 through 6 are sectional views illustrating an embodiment of a semiconductor memory device at various fabrication stages constructed according to aspects of the present disclosure in another embodiment.
Figure 6:
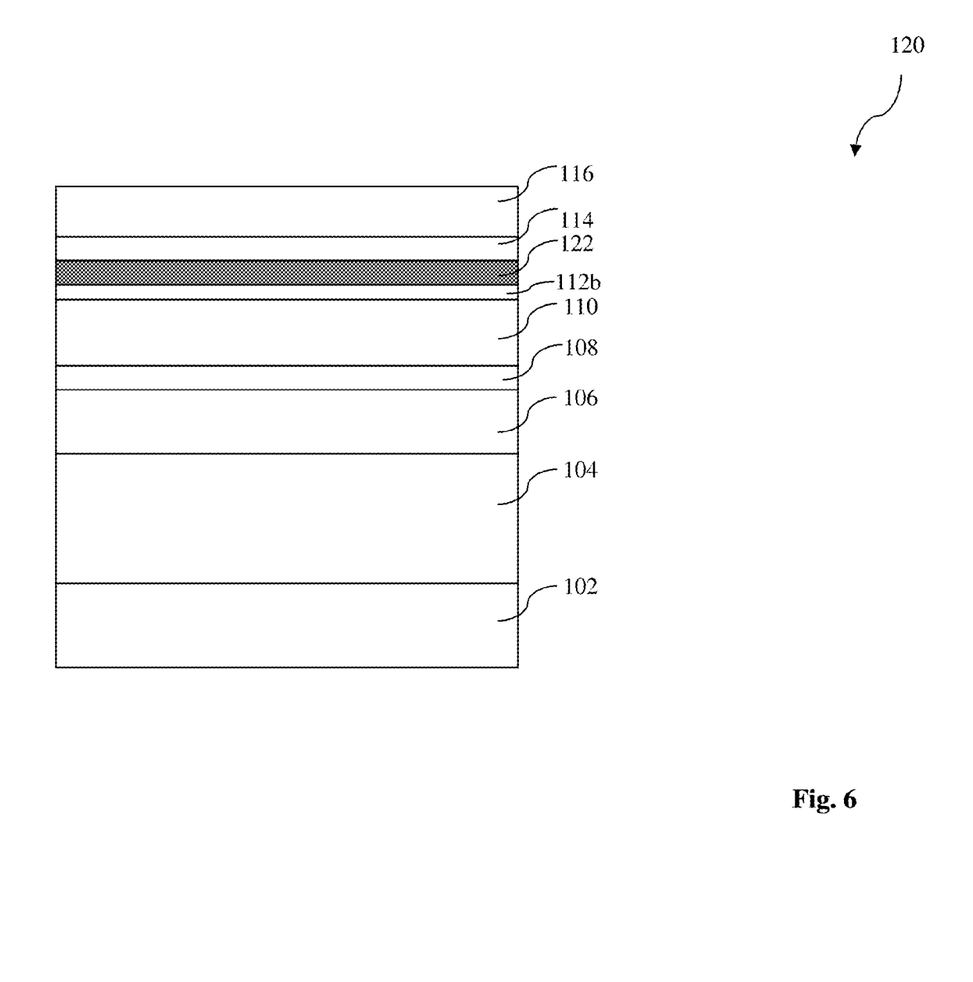
Figure 7:
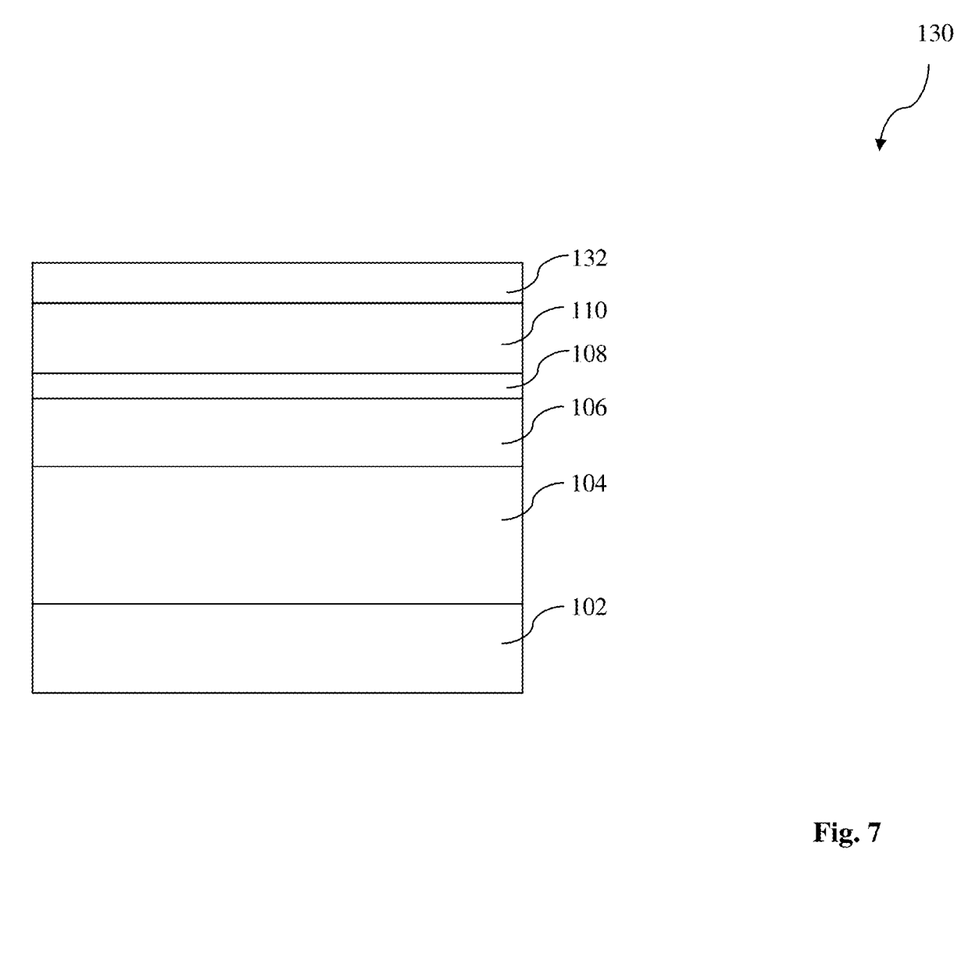
FIGS. 7 through 9 are sectional views illustrating an embodiment of a semiconductor memory device at various fabrication stages constructed according to aspects of the present disclosure in another embodiment.
Figure 8:
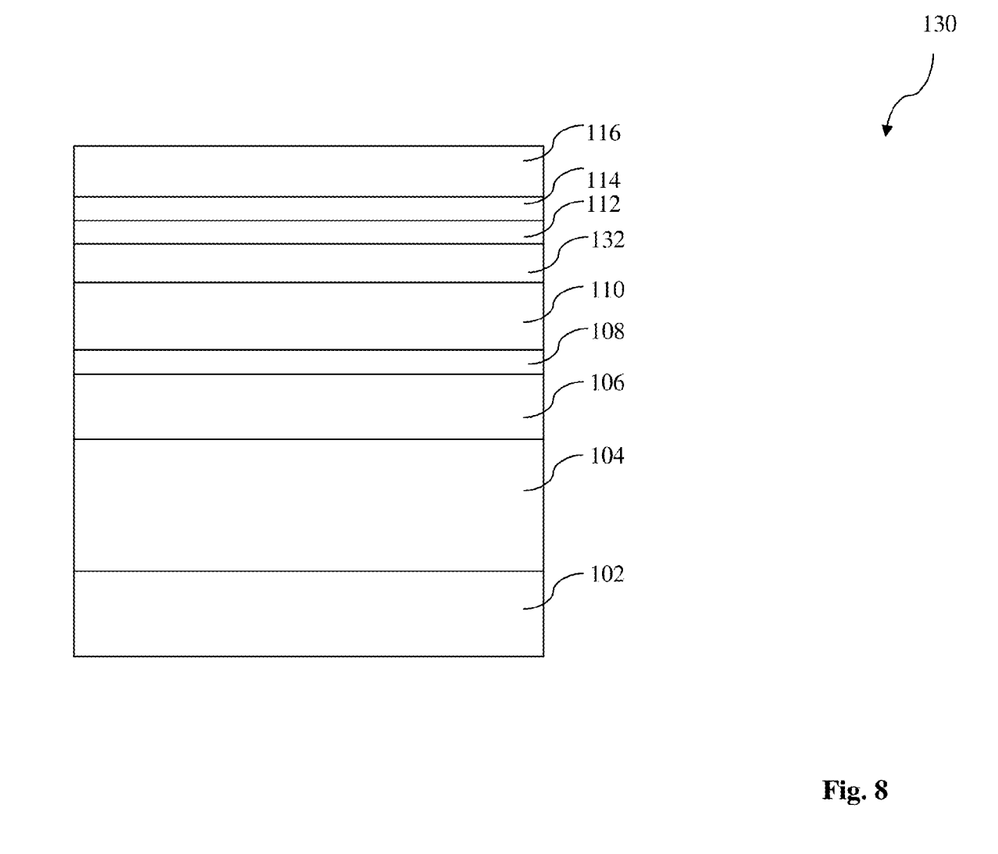
Figure 9:
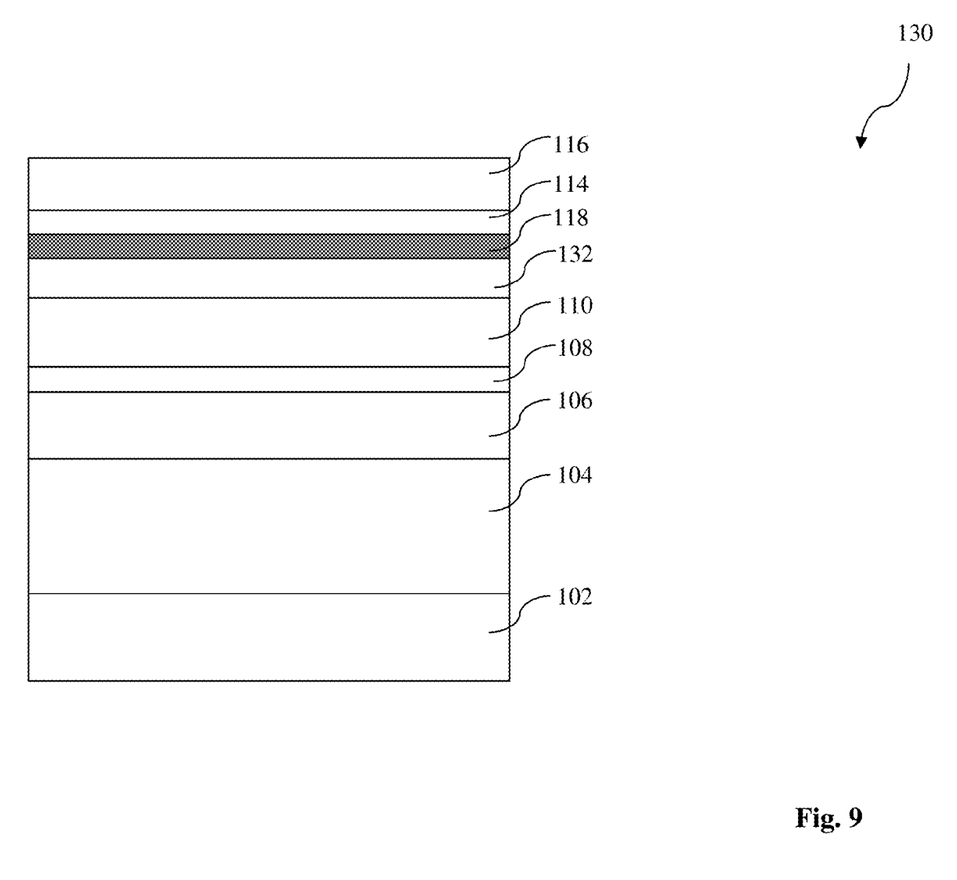

FIG. 1 is a flowchart of a method 50 making of a semiconductor memory device constructed according to aspects of the present disclosure in various embodiments. FIGS. 2 through 4 are sectional views illustrating an embodiment of a semiconductor memory device 100 at various fabrication stages constructed according to aspects of the present disclosure. FIGS. 5 through 6 are sectional views illustrating another embodiment of a semiconductor memory device 120 at various fabrication stages constructed according to aspects of the present disclosure. FIGS. 7 through 9 are sectional views illustrating another embodiment of a semiconductor memory device 130 at various fabrication stages constructed according to aspects of the present disclosure. With references to FIGS. 1 through 9, the semiconductor memory device and the method making the same are collectively described according to various embodiments.

Referring to FIG. 2, the semiconductor memory device 100 is a portion of one spin torque transfer magnetic random access memory (STT-MRAM). In one embodiment, the semiconductor memory device 100 includes a stack of material layers designed and configured to function as a magnetic tunnel junction (MTJ).

The semiconductor memory device 100 is formed on a semiconductor substrate, such as silicon substrate or alternatively other suitable semiconductor substrate. The semiconductor memory device 100 includes a first electrode (or bottom electrode) 102 of conductive material. In one embodiment, the first electrode 102 includes tantalum (Ta). In other embodiments, the first electrode may include other appropriate materials for forming such an electrode, such as platinum (Pt) or ruthenium (Ru). The first electrode 102 can be formed by a physical vapor deposition (PVD or sputtering) or alternatively other suitable processes. In another embodiment, the first electrode 102 has a thickness ranging between about 100 angstrom and about 300 angstrom.

Referring to FIGS. 1 and 2, the method 50 begins at step 52 by forming a pinning layer 104 over the first electrode 102. In one embodiment, the pining layer 104 includes an anti-ferromagnetic (AFM) material. In the anti-ferromagnetic material, the magnetic moments of atoms or molecules align in a regular pattern with neighboring spins pointing in opposite directions. In one example, the anti-ferromagnetic layer 104 includes platinum manganese (PtMn). In another example, the anti-ferromagnetic layer 104 includes iridium manganese ("IrMn"), rhodium manganese ("RhMn"), and iron manganese ("FeMn"). In another example, the anti-ferromagnetic layer has a thickness ranging between about 100 angstrom and about 200 angstrom. The pinning layer 104 is formed by a suitable deposition technique, such as PVD.

Still referring to FIGS. 1 and 2, the method 50 proceeds to step 54 by forming a pinned layer 106 over the pinning layer 104. In one embodiment, the pinned layer 106 includes a ferromagnetic material layer, therefore also referred to as pinned ferromagnetic layer. The ferromagnetic material can form permanent magnets and/or exhibit strong interactions with magnets. In one embodiment, the ferromagnetic layer 106 includes a cobalt-iron-boron (CoFeB) film. The ferromagnetic material layer may alternatively include other materials, such as CoFeTa, NiFe, Co, CoFe, CoPt, CoPd, FePt, or the alloy of Ni, Co and Fe. As one example, the CoFeB film is formed by PVD, or alternatively other suitable process.

The pinned layer 106 may alternatively include a synthetic anti-ferromagnetic (SAF) layer having a three-layer structure. In one embodiment, the pinned layer 106 includes a first pinned layer (or bottom pinned layer) and a second pinned layer (or top pinned layer) interposed by a spacer layer. In this embodiment, the first pinned layer is disposed on the pining layer 104. In furtherance of the embodiment, the first pinned layer includes a ferromagnetic material. In one example, the ferromagnetic material in the first pinned layer includes a CoFeB film. The ferromagnetic material layer may alternatively include other materials, such as CoFeTa, NiFe, Co, CoFe, CoPt, CoPd, FePt, or the alloy of Ni, Co and Fe. The first pinned layer may have a thickness ranging between about 15 angstrom and about 35 angstrom.

The spacer layer is disposed on the first pinned layer. In one embodiment, the spacer layer includes ruthenium (Ru). Alternatively, the spacer layer may include other suitable material, such as Ti, Ta, Cu, or Ag. In one example, the spacer layer has a thickness ranging between about 5 angstrom and about 10 angstrom. The spacer layer may be formed by a PVD process, or another suitable process.

The second pinned layer is disposed on the spacer layer. As one embodiment, the second pinned layer includes a ferromagnetic material layer substantially similar to that of the first pinned layer. For example, the second pinned layer includes a cobalt-iron-boron (CoFeB) film. In one example, the second pinned layer has a thickness ranging between about 15 angstrom and about 35 angstrom. The second pinned layer may be formed by PVD, or other alternative processing method.

In another alternatively embodiment, the pinned layer 106 includes a SAF layer with multiple films. The pinned layer 106 includes a first pinned layer and a second pinned layer interposed by a spacer layer. At least one of the first and second pinned layer includes two or more ferromagnetic films. Particularly, the first pinned layer includes a first film of a first ferromagnetic material and a second film of a second ferromagnetic material. The second pinned layer includes a third film of the first ferromagnetic material and a fourth film of the second ferromagnetic material.

Thus formed pinned layer with a synthetic AFM provides greater exchange bias. In one embodiment, the pinned layer 106 includes a combination of a CoFeB film (the first film), CoFe (the second film), a Ru layer (the spacer layer), a CoFeB film (the third film), and a CoFe layer (the fourth film) stacked together. In one example, each of the first through the fourth films has a thickness ranging between about 10 angstrom and about 30 angstrom. Each film may have a thickness different from other films for enhanced performance of the pinned layer. However, it will be recognized that the pinned layer 106 may be implemented using other types of materials and combinations of materials appropriate for implementing a pinned ferromagnetic layer.

As will be recognized by one of ordinary skill in the art, a purpose of the pinning layer 104 is to fix, or pin, the magnetization direction of the pinned ferromagnetic layer 106 through anti-ferromagnetic coupling.

Still referring to FIGS. 1 and 2, the method 50 proceeds to step 56 by forming a tunneling barrier layer (or barrier layer) 108 on the pinned layer 106. The barrier layer 108 includes a non-magnetic material. In one embodiment, the barrier layer 108 includes magnesium oxide (MgO). Alternatively, the barrier layer 108 may include aluminum oxide (AlO), aluminum nitride (AlN), aluminum oxynitride (AlON), or other suitable non-magnetic material. In another embodiment, the barrier layer 108 includes a first film of MgO and a second film of Mg over the first film, which may be formed by Mg deposition, Mg oxidation and Mg deposition. The barrier layer 108 is thin enough such that electrons can tunnel through the barrier layer when a biasing voltage is applied on. In one embodiment, the barrier layer 108 has a thickness ranging between about 5 angstrom and about 15 angstrom. The barrier layer 108 may be formed by PVD. For example, a magnesium target is used with an oxygen gas provided in a sputtering chamber to form magnesium oxide. Alternatively, a magnesium film is formed first by sputtering and then converting it into the MgO film by applying an oxygen plasma. In another embodiment of the barrier layer, a first magnesium film is formed by sputtering and then converting it into the MgO film by applying an oxygen gas, and then a second Mg layer is deposited on the MgO layer by sputtering.

Still referring to FIGS. 1 and 2, the method 50 proceeds to step 58 by forming a free layer 110 on the barrier layer 108. The free layer 110 also includes a ferromagnetic material but it is not pinned. Therefore, the magnetic orientation of the layer is free, thus referred to as a free layer or free ferromagnetic layer. The free layer 110 may include a ferromagnetic material, such as the ferromagnetic material used in the pinned layer 106. As will be recognized by one of ordinary skill in the art, the magnetization direction of the free ferromagnetic layer 110 is free to rotate parallel or anti-parallel to the pinned magnetization of the pinned layer 106. A tunneling current flows perpendicularly through the tunneling barrier layer 108 depending upon the relative magnetization directions of the two ferromagnetic layers 106 and 110.

In one embodiment, the free layer 110 includes a CoFeB film. In one example, the CoFeB may have compositions expressed in $(Co_xFe_{1-x})_{80}B_{20}$, wherein the x is an alloy mole fraction and ranges between 0 and 100. the subscripts "80" and "20" are also mole fractions. In another example, the CoFeB may have compositions expressed in $Co_{20}Fe_{60}B_{20}$. The free layer 110 may have a thickness ranging between about 10 angstrom and about 20 angstrom. The free layer 110 may be formed by a process, such as PVD.

The free layer may include two or more ferromagnetic films of different materials and may be further interposed by a spacer layer between neighbor ferromagnetic films. In one alternative embodiment, the free layer 110 includes a first ferromagnetic film disposed on the barrier layer 108 and a second ferromagnetic film disposed over the first ferromagnetic film. Particularly, the first ferromagnetic film includes a hard ferromagnetic material having a first coercivity. In one example, the first ferromagnetic film includes a CoFeB film. The hard ferromagnetic material layer may have a thickness ranging between about 10 angstrom and about 20 angstrom. The first ferromagnetic film may be formed by a process, such as PVD. The second ferromagnetic film includes a soft ferromagnetic material having a second coercivity less than the first coercivity of the first ferromagnetic film. In one example, the second ferromagnetic film includes a nickel iron (NiFe) film. The soft ferromagnetic material layer may have a thickness less than the thickness of the first ferromagnetic film. The second ferromagnetic film may be formed by a process, such as PVD. A spacer layer may be additionally formed between the first and second ferromagnetic films. The spacer layer may include Ta, Ru, copper (Cu), other suitable material or combinations thereof.

Referring to FIGS. 1 and 3, the method 50 proceeds to step 60 by forming an oxygen absorption layer 112 over the free layer 110. The oxygen absorption layer 112 is disposed on the free layer 110. In one embodiment, the oxygen absorption layer 112 includes a metal, such as pure metal or metal alloy, that is able to absorb the oxygen and avoid oxygen diffusion to the free layer 110, therefore protecting the free layer 110 from oxygen degradation. Furthermore, the oxygen absorption layer 112 includes a metal (pure metal or metal alloy) that is able to be transformed to a conductive oxide after absorbing the oxygen at subsequent high temperature processes. In various embodiments, the oxygen-absorption layer 112 includes tin-doped indium (IT), ruthenium (Ru), titanium (Ti), tantalum (Ta), gallium zinc (GaZn), aluminum zinc (AlZn), or iron (Fe).

Still referring to FIGS. 1 and 3, the method 50 proceeds to step 62 by forming an oxygen-based cap layer 114 over the oxygen absorption layer 112. The oxygen-based cap layer 114 includes an oxygen-based compound. In the present embodiment, the oxygen-based cap layer 114 includes a dielectric oxide layer, such as, for example, magnesium oxide (MgO), or aluminum oxide (AlO). The oxygen-based cop layer may alternatively include tantalum oxide (TaO), or titanium oxide (TiO). The oxygen-based cap layer 114 can effectively reduce the switching current density. However, the oxidation effect from the oxide cap layer due to high temperatures applied during BEOL fabrication processes results in serious degradation of the spin torque transfer ("STT") performance of the MRAM in general and the magnetic performance of the free layer in particular.

The oxygen-absorption layer 112 and the oxygen-based cap layer 114 form a cap layer. The inclusion of the oxygen absorption layer 112 can effectively reduce $R_{high}$, $R_{low}$, $V_{sw+}$ and $V_{sw-}$ characteristics of the MTJ stack and provide good interface stability during the BEOL high temperature processes Still referring to FIGS. 1 and 3, the method 50 proceeds to step 64 by forming a top electrode 116 on the oxygen-based cap layer 114. In one embodiment, the top electrode 116 includes tantalum. Alternatively, the top electrode 116 includes other suitable conductive material to electrically connect the device to other portion of the interconnect structure for electrical routing. The top electrode may be formed by a PVD process in one embodiment.

Referring to FIGS. 1 and 4, the oxygen absorption layer 112 is transformed into a conductive oxide 118 after various BEOL high temperature processes 66. Thus formed memory device 100 includes a conductive oxide 118 interposed between the free layer 110 and the oxygen-based cap layer 114. In various embodiments, the conductive oxide layer 118 includes tin-doped indium oxide (ITO), ruthenium oxide (RuO), titanium oxide (TiO), tantalum oxide (TaO), gallium zinc oxide (GaZnO), aluminum zinc oxide (AlZnO), or iron zinc oxide (FeO). In one embodiment, the conductive oxide layer 118 may have a thickness of approximately 50 Å or less. It should be noted that the oxygen absorber layer 112 will be deposited as a conductive film and will transform to a conductive oxide layer 118 from a metal film after the BEOL high temperature processes.

Other steps may be implemented before, during and/or after the method 50. In one example, the material stack formed above is further patterned to form one or more MTJs. In another example, various active devices, such as field effect transistors, may be formed in the substrate by ion implantation, annealing and other processes. In another example, various interconnect features, including metal lines and vias/contacts, may be formed on the substrate to provide electrical routing to various devices including one or more MTJs, forming a functional integrated circuit.

Another embodiment of the method 50 and the semiconductor memory device 120 formed thereby are provided below with references to FIGS. 5 and 6. Referring to FIGS. 1 and 5, various MTJ material layers, including the pinning layer 104, the pinned layer 106, the barrier layer 108, the free layer 110 and the oxygen-based cap layer 114, are formed. Accordingly, the oxygen absorption layer 112a is formed between the free layer 110 and the oxygen-based cap layer 114. The oxygen absorption layer 112a has a thickness greater than the thickness of the oxygen absorption layer 112. Referring to FIGS. 1 and 6, only a portion of the oxygen absorption layer 112a is transformed into a conductive oxide layer 122 after various BEOL high temperature processes 66. Another portion 112b of the oxygen absorption layer 112 remains between the conductive oxide layer 122 and the free layer 110. Thus formed memory device 120 includes the oxygen absorption layer 112b and the conductive oxide layer 112b over the oxygen absorption layer 112b. The oxygen absorption layer 112b and the conductive oxide layer 122 are interposed between the free layer 110 and the oxygen-based cap layer 114. Particularly, the oxygen absorption layer 112b includes a metal or metal alloy and the conductive oxide layer 112b includes the oxide of the corresponding metal or metal alloy. For example, when the oxygen absorption layer 112b include tin-doped indium (IT), then the conductive oxide layer 112b includes tin-doped indium oxide (ITO). In another example, when the oxygen absorption layer 112b include ruthenium, then the conductive oxide layer 112b includes ruthenium oxide.

Another embodiment of the method 50 and the semiconductor memory device 130 formed thereby are provided below with references to FIGS. 7 through 9. The present embodiment, the step 60 is replaced by the steps 68 and 70. Referring to FIGS. 1 and 7, various MTJ material layers, including the pinning layer 104, the pinned layer 106, the barrier layer 108 and the free layer 110 are formed through respective steps 52 through 58. Then the method 50 proceeds to step 68 by forming a diffusion barrier layer 132 on the free layer 110. In one embodiment, the diffusion barrier layer 132 may include a metal such as titanium (Ti) or tantalum (Ta). The diffusion barrier layer 132 may be deposited by PVD.

Referring to FIGS. 1 and 8, the method 100 proceeds to step 70 by forming an oxygen absorption layer 112 over the diffusion barrier layer 132. The oxygen absorption layer 112 is similar to the oxygen absorption layer 112 in the device 100. In one embodiment, the oxygen absorption layer 112 includes a metal or metal alloy that is able to absorb the oxygen. Furthermore, the oxygen absorption layer 112 includes a metal or metal alloy that be able to be transformed to a conductive oxide after absorbing the oxygen at subsequent high temperature process(es). In various embodiments, the oxygen-absorption layer 112 includes IT, Ru, Ti, Ta, GaZn, AlZn, or Fe.

Still referring to FIGS. 1 and 8, the method 50 proceeds to step 62 by forming an oxygen-based cap layer 114 over the oxygen absorption layer 112, followed by step 64 by forming the top electrode 116 on the oxygen-based cap layer 114. Those steps are similar to the respective steps to form the device 100 in terms of composition and deposition.

Referring to FIGS. 1 and 9, the oxygen absorption layer 112 is transformed into a conductive oxide 118 after various BEOL high temperature processes 66. Thus formed memory device 100 includes a conductive oxide 118 interposed between the free layer 110 and the oxygen-based cap layer 114. In various embodiments, the conductive oxide layer 118 includes ITO, RuO, TiO, TaO, GaZnO, AlZnO, or FeO. In one embodiment, the conductive oxide layer 118 may have a thickness of approximately 50 Å or less.

Various embodiments of the MRAM device and the method making the same are disclosed above. For example, the MTJ made by the disclosed method in various embodiments results in the corresponding structure, such as the memory device 100 in FIG. 4, the memory device 120 in FIG. 6, or the memory device 100 in FIG. 9. Particularly, the MTJ stack includes a cap over the free layer. In one embodiment, the cap includes an oxygen-based cap layer and a conductive oxide layer. In another embodiment, the cap includes an oxygen-based cap layer, a conductive oxide layer, and a diffusion barrier layer. In another embodiment, the cap includes a conductive oxide layer and a dielectric oxide layer over the conductive oxide. In another embodiment, the cap includes a metal layer, a conductive oxide layer over the metal layer, and a dielectric oxide layer over the conductive oxide. It will be recognized that inclusion of the oxygen-based cap layer in the MTJ stack reduces writing current density (Jc+ and Jc−) in which it is included; however, the cap layer also increases the high resistance (Rap) and low resistance (Rp) and degenerates MR % of the MRAM device. An oxygen absorption layer (such as the layer 112) effectively absorbs the oxygen diffused from the oxygen-based cap layer 114 and improves MR % while maintaining low Rap and Rp, due to the conductivity of the layer. The diffusion barrier layer 132 disposed on the free layer 110 further improves MR % and Hc.

The present disclosure provides one embodiment of a MTJ stack for an MRAM device. The MTJ stack includes a pinned ferromagnetic layer over a pinning layer; a tunneling barrier layer over the pinned ferromagnetic layer; a free ferromagnetic layer over the tunneling barrier layer; a conductive oxide layer over the free ferromagnetic layer; and a oxygen-based cap layer over the conductive oxide layer.

In one example, the MTJ stack further includes a diffusion barrier layer interposed between the free ferromagnetic layer and the conductive oxide layer.

In another example, the oxygen-based cap layer includes one of magnesium oxide (MgO) and aluminum oxide (AlO).

In yet another example, the conductive oxide layer includes one of tin-doped indium oxide (ITO), ruthenium oxide (RuO), titanium oxide (TiO), tantalum oxide (TaO), gallium zinc oxide (GaZnO), aluminum zinc oxide (AlZnO), and iron oxide (FeO).

In yet another example, the conductive oxide layer has a thickness of approximately 50 Å or less.

In yet another example, the MTJ stack further includes a diffusion barrier layer.

In yet another example, the diffusion barrier layer includes one of titanium and tantalum.

The present disclosure also provides an embodiment of a cap layer for MTJ stack for an MRAM device. The cap layer is disposed over a free ferromagnetic layer of the MTJ stack and includes a diffusion barrier layer having a metal; a conductive oxide disposed over the diffusion barrier layer; and an oxygen-based cap layer over the conductive oxide layer.

In one example, the oxygen-based cap layer includes a dielectric oxide layer. In another example, the dielectric oxide layer includes one of magnesium oxide (MgO), and aluminum oxide (AlO).

In another example, the conductive oxide layer includes one of tin-doped indium oxide (ITO), ruthenium oxide (RuO), titanium oxide (TiO), tantalum oxide (TaO), gallium zinc oxide (GaZnO), aluminum zinc oxide (AlZnO), and iron oxide (FeO).

In another example, the conductive oxide layer includes an oxide of the metal that is used in the diffusion barrier layer. In another example, the conductive oxide layer has a thickness of approximately 50 Å or less.

In another example, the diffusion layer includes one of titanium and tantalum.

The present disclosure also provides a method of fabricating an MTJ stack for an MRAM device. The method includes forming a pinned ferromagnetic layer disposed over a pinning layer; forming a tunneling barrier layer disposed over the pinned ferromagnetic layer; forming a free ferromagnetic layer disposed over the tunneling barrier layer; depositing a metal layer disposed over the free ferromagnetic layer; and forming an oxygen-based cap layer disposed over the metal layer.

In one example, the method further includes comprising performing a high temperature process, transforming at least a portion of the metal layer into a conductive oxide layer.

In another example, the depositing a metal layer includes depositing one of tin-doped indium (IT), ruthenium (Ru), titanium (Ti), tantalum (Ta), gallium zinc (GaZn), aluminum zinc (AlZn), and iron (Fe).

In another example, the transforming at least a portion of the metal layer includes transforming at least a portion of the metal layer into one of tin-doped indium oxide (ITO), ruthenium oxide (RuO), titanium oxide (TiO), tantalum oxide (TaO), gallium zinc oxide (GaZnO), aluminum zinc oxide (AlZnO), and iron oxide (FeO).

In another example, the conductive oxide layer has a thickness of approximately 50 Å or less.

In another example, the method further includes forming a diffusion barrier layer between the free ferromagnetic layer and the metal layer, the diffusion barrier layer including another metal, such as one of titanium and tantalum.

In another example, the forming an oxygen-based cap layer includes depositing a dielectric oxide layer. In another example, the forming an oxygen-based cap layer includes depositing one of magnesium oxide (MgO), and aluminum oxide (AlO)

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A MTJ stack for an MRAM device, the MTJ stack comprising:
   a pinned ferromagnetic layer over a pinning layer;
   a dielectric tunneling barrier layer over the pinned ferromagnetic layer;
   a free ferromagnetic layer over the dielectric tunneling barrier layer;
   a conductive oxide layer over the free ferromagnetic layer; and
   a oxygen-based cap layer over the conductive oxide layer.

2. The MTJ stack of claim 1 further comprising a diffusion barrier layer interposed between the free ferromagnetic layer and the conductive oxide layer.

3. The MTJ stack of claim 1 wherein the oxygen-based cap layer includes one of magnesium oxide (MgO) and aluminum oxide (AlO).

4. The MTJ stack of claim 1 wherein the conductive oxide layer includes one of tin-doped indium oxide (ITO), ruthenium oxide (RuO), titanium oxide (TiO), tantalum oxide (TaO), gallium zinc oxide (GaZnO), aluminum zinc oxide (AlZnO), and iron oxide (FeO).

5. The MTJ stack of claim 1 wherein the conductive oxide layer has a thickness of approximately 50 Å or less.

6. The MTJ stack of claim 1 further comprising a diffusion barrier layer.

7. The MTJ stack of claim 6 wherein the diffusion barrier layer includes one of titanium and tantalum.

8. A cap layer for an MTJ stack for an MRAM device, the cap layer comprising:
   a diffusion barrier layer having a metal;
   a conductive oxide layer disposed over the diffusion barrier layer; and
   an oxygen-based cap layer over the conductive oxide layer,
   wherein the cap layer is disposed over a free ferromagnetic layer of the MTJ stack, and wherein the MTJ stack includes:
      a pinned ferromagnetic layer over a pinning layer;
      a dielectric tunneling barrier layer over the pinned ferromagnetic layer; and
      the free ferromagnetic layer over the dielectric tunneling barrier layer.

9. The cap layer of claim 8 wherein the oxygen-based cap layer includes a dielectric oxide layer.

10. The cap layer of claim 9 wherein the dielectric oxide layer includes one of magnesium oxide (MgO) and aluminum oxide (AlO).

11. The cap layer of claim 8 wherein the conductive oxide layer includes one of tin-doped indium oxide (ITO), ruthenium oxide (RuO), titanium oxide (TiO), tantalum oxide (TaO), gallium zinc oxide (GaZnO), aluminum zinc oxide (AlZnO), and iron oxide (FeO).

12. The cap layer of claim 8 wherein the conductive oxide layer includes an oxide of the metal.

13. The cap layer of claim 8 wherein the conductive oxide layer has a thickness of approximately 50 Å or less.

14. The cap layer of claim 8 wherein the diffusion barrier layer includes one of titanium and tantalum.

15. An MTJ stack for an MRAM device comprising:
   a pinned ferromagnetic layer disposed over a pinning layer;
   a dielectric tunneling barrier layer disposed over the pinned ferromagnetic layer;
   a free ferromagnetic layer disposed over the dielectric tunneling barrier layer;
   a metal-containing layer disposed over the free ferromagnetic layer;
   a conductive oxide layer disposed over the metal-containing layer; and
   an oxygen-based cap layer disposed over the conductive oxide layer.

16. The device of claim 15 wherein the metal-containing layer includes one of tin-doped indium (IT), ruthenium (Ru), titanium (Ti), tantalum (Ta), gallium zinc (GaZn), aluminum zinc (AlZn), and iron (Fe).

17. The device of claim 15 further comprising a diffusion barrier layer between the free ferromagnetic layer and the metal-containing layer, the diffusion barrier layer including another metal.

18. The device of claim 17 wherein the diffusion barrier layer comprises one of titanium and tantalum.

19. The device of claim 15 wherein the oxygen-based cap layer includes a dielectric oxide layer.

20. The device of claim 19 wherein the oxygen-based cap layer includes one of magnesium oxide (MgO) and aluminum oxide (AlO).

* * * * *